(12) United States Patent
Waldenmeier et al.

(10) Patent No.: US 10,873,141 B2
(45) Date of Patent: Dec. 22, 2020

(54) ELECTRICAL CONTACT ASSEMBLY

(71) Applicant: Robert Bosch GmbH, Stuttgart (DE)

(72) Inventors: Steffen Waldenmeier, Kieselbronn (DE); Uwe Katzenwadel, Oberriexingen (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 16/603,513

(22) PCT Filed: Mar. 27, 2018

(86) PCT No.: PCT/EP2018/057799
§ 371 (c)(1),
(2) Date: Oct. 7, 2019

(87) PCT Pub. No.: WO2018/188947
PCT Pub. Date: Oct. 18, 2018

(65) Prior Publication Data
US 2020/0052423 A1 Feb. 13, 2020

(30) Foreign Application Priority Data
Apr. 11, 2017 (DE) .......................... 10 2017 206 217

(51) Int. Cl.
*H01R 12/58* (2011.01)
*H05K 3/30* (2006.01)
*H01R 12/57* (2011.01)

(52) U.S. Cl.
CPC ............ *H01R 12/585* (2013.01); *H01R 12/57* (2013.01); *H05K 3/301* (2013.01); *H01R 2201/26* (2013.01); *H05K 2201/10189* (2013.01)

(58) Field of Classification Search
CPC .......... H05K 2201/10333; H05K 2201/10325; H05K 2201/1031
See application file for complete search history.

(56) References Cited

U.S. PATENT DOCUMENTS

| | | | | | |
|---|---|---|---|---|---|
| 4,056,302 A | * | 11/1977 | Braun | .................. | H05K 3/3426 439/709 |
| 5,607,313 A | * | 3/1997 | Nyman | .................. | H01R 12/57 439/83 |
| 2012/0127681 A1 | * | 5/2012 | Ryu | ........................ | H05K 3/306 361/772 |

FOREIGN PATENT DOCUMENTS

CN 1145539 A 3/1997
CN 104936429 A 9/2015
(Continued)

OTHER PUBLICATIONS

International Search Report corresponding to PCT Application No. PCT/EP2018/057799, dated Jun. 6, 2018 (German and English language document) (7 pages).

*Primary Examiner* — Ross N Gushi
(74) *Attorney, Agent, or Firm* — Maginot, Moore & Beck LLP

(57) ABSTRACT

An electrical contact assembly for connecting a press-in contact to an electronic circuit includes a circuit board, which is provided with the electronic circuit, a receiving opening for pressing in a press-in contact, which receiving opening is continuously provided with an electrically conductive inner wall, and at least one conducting track of the circuit board, which conducting track is electrically connected to the inner wall and to the electronic circuit. The receiving opening is formed on a contact body electrically connected to the conducting track, which contact body is applied to a component side of the circuit board as an SMT-capable component.

11 Claims, 3 Drawing Sheets

(56) References Cited

FOREIGN PATENT DOCUMENTS

| | | |
|---|---|---|
| DE | 10 2012 213 812 A1 | 2/2014 |
| DE | 10 2015 214 311 A1 | 2/2017 |
| EP | 2 312 703 A1 | 4/2011 |
| JP | H04-132250 A | 5/1992 |
| JP | 4-162377 A | 6/1992 |
| JP | H11-040713 A | 2/1999 |
| JP | 2006-302906 A | 11/2006 |
| WO | 2010/018655 A1 | 2/2010 |

* cited by examiner

ELECTRICAL CONTACT ASSEMBLY

This application is a 35 U.S.C. § 371 National Stage Application of PCT/EP2018/057799, filed on Mar. 27, 2018, which claims the benefit of priority to Serial No. DE 10 2017 206 217.7, filed on Apr. 11, 2017 in Germany, the disclosures of which are incorporated herein by reference in their entirety.

BACKGROUND

For electrically connecting printed circuit boards and press-in contacts, providing the printed circuit board with a receiving opening in the form of a metallized through-recess which is electrically connected to at least one conductor track of the printed circuit board is known from the prior art. A press-in contact can be pressed into the receiving opening from one side of the printed circuit board. For this purpose, the press-in contact can have a section, for example, of which the outer walls press against the inner wall of the metallized through-recess during pressing in, wherein multiple geometries can be introduced. Such electrical contacts serve the purpose of connecting the contact pins of plugs or electronic components to the printed circuit board. In the literature, this printed circuit board contacting is also described as plug-through mounting, since the press-in contact can in some cases be guided through to the opposite side of the printed circuit board, starting from a component fitting side.

An electrical contact assembly of the prior art is known from DE 10 2012 213 812 A1, for example.

SUMMARY

The disclosure relates to an electrical contact assembly for connecting a press-in contact to an electronic circuit. The contact assembly comprises a printed circuit board which is provided with the electronic circuit, a receiving opening for pressing in a press-in contact, which receiving opening is provided with an electrically conductive inner wall throughout, and at least one conductor track of the printed circuit board, which conductor track is electrically connected to the electrically conductive inner wall and to the electronic circuit. It is proposed according to the disclosure that the receiving opening is formed on a contact body which is electrically connected to the conductor track and which is deposited onto a component fitting side of the printed circuit board as an SMT-capable component (SMT: Surface Mount Technology). This comprises embodiments with a single contact body, which has precisely one receiving opening for one single press-in contact, as well as embodiments with numerous contact bodies which are fitted on the printed circuit board and have, for example, precisely one receiving opening respectively. An implementation is also possible with one or a plurality of contact bodies which each have a plurality of receiving openings for press-in contacts associated with the receiving openings respectively.

An SMD component (SMD: Surface Mount Device) is intended to be understood to mean a component which, in contrast to components of plug-through mounting (THT: Through Hole Technology), has no wire bondings for plug-through mounting, but rather can be soldered directly onto contact faces of the printed circuit board by means of solderable connection faces on the surface of the printed circuit board. This surface-mounting technology is also known as SMT.

A printed circuit board is intended to be understood to mean a rigid printed circuit board substrate which is provided with conductor tracks in at least one location or even in a plurality of locations, preferably made from glass fiber-reinforced epoxy resin material, which is known as FR4 material, FR5 material or higher grade in the art.

The proposed electrical contact assembly has the advantage that continuous receiving openings do not have to be provided on the printed circuit board or these receiving openings can be covered with the contact body. This is particularly advantageous if a potting compound is introduced on the printed circuit board, in order to protect the components which are fitted onto the printed circuit board. The potting technology, also known as HCD (HCD: Hard Cover Dispense), has lately become increasingly important in order to make it possible to also introduce electronic circuit parts in aggressive environments while simultaneously dispensing with the often complex covering with metallic housing shells. For this purpose, a circumferential insulating material can be dispensed onto the component fitting side of the printed circuit board, for example. Subsequently, the potting compound, for example a curable epoxy resin, is poured into the surface area, which is surrounded by the insulating material, on the component fitting side of the printed circuit board. If this surface area has through-openings, the potting compound could run downward due to gravity. For this reason, the known plug-through mounting cannot be easily introduced in combination with a potting compound. Expensive and space-demanding additional measures would be necessary, such as an additional wall surrounding the through-opening, which wall prevents the potting compound from flowing or entering into the through-openings during the pouring process. In the case of the solution proposed here, the receiving opening, which is necessary for receiving the press-in contact and which is provided with the electrically conductive inner wall, is advantageously formed in a contact body which can be fitted onto the printed circuit board as a separate structural part using SMT mounting. The contact body advantageously makes it possible to combine an electrical contacting by means of press-in contacts with the advantages of a potting compound for covering components on the printed circuit board. For this purpose, the contact body has a receiving opening which is provided with an electrically conductive inner wall throughout and into which receiving opening the press-in contact can be pressed. The receiving opening can be formed, for example, as a simple bore, in particular as a through-bore in a metallic contact body. During pressing in, the press-in contact presses against the inner wall (press-fit contact) and, regardless of the press-in depth, produces the electrical connection to the contact body. The contact body can be formed cost-effectively, completely from metal or, for example, as a plastics material part with a metallic inner sleeve in which the receiving opening is assembled. By introducing the contact body, it is advantageously ensured that a press-in contact is able to be pressed into the receiving opening, even after a reflow soldering process of the printed circuit board, for contacting electronic components.

Advantageous configurations and developments of the disclosure are made possible by the features disclosed herein.

The contact body advantageously has a mounting face which faces the printed circuit board, an outer face which faces away from the mounting face, and a circumferential peripheral face, wherein the receiving opening, starting from the outer face, extends into the contact body perpendicular to the component fitting side of the printed circuit board. The mounting face can preferably be formed in a planar manner, making an accurately fitting abutment against a contact face of the component fitting side of the printed circuit board possible. During manufacture, the contact body can be deposited easily onto the printed circuit board as a compact structural part by means of an SMD component fitting device. The SMD component fitting device can receive the contact body on the planar outer face and place it onto the contact face of the printed circuit board, for example by means of a suction head.

The receiving opening can also extend into the contact body as a blind hole. However, an embodiment in which the receiving opening is formed as a through-opening which passes through the contact body from the outer face to the mounting face is particularly preferable.

Additionally, it can be provided that the printed circuit board has a recess which adjoins the receiving opening. This recess can in particular run coaxially to the receiving opening. The recess can serve to receive an end of the press-in contact which can optionally also stick out from the contact body on the mounting face, such that it is possible to press the press-in contact deeper into the receiving opening than when this additional recess is not present.

The recess of the printed circuit board preferably serves to receive a centering collar. The contact body can have a centering collar which protrudes from the mounting face and projects into the recess of the printed circuit board. The contact body is aligned with the printed circuit board by this centering collar butting against the inner wall of the recess. Since the press-in contact can be aligned just by being pressed into the receiving opening of the contact body, said contact body can therefore advantageously also define the location of the press-in contact and of the structural part which is optionally fitted onto the printed circuit board with the press-in contact (for example an electrolytic capacitor or plug part).

The contact body can advantageously be formed in a particularly simple and cost-effective manner, for example in the form of a socket with a circumferential, cylindrical peripheral face. The receiving opening can be formed as a cylindrical channel by a central bore in the contact body, for example.

The contact body can advantageously be directly deposited onto a contact face connected to the conductor track, with the mounting face, on the component fitting side of the printed circuit board, and the peripheral face can be at least partially electrically and mechanically connected to the contact face by means of a solder application which encircles the peripheral face. This can be advantageously achieved using well-established SMT technology.

Using the contact body in connection with the potting of the printed circuit board is particularly advantageous. In this way, the electronic circuit on the component fitting side can be completely or at least partially covered with a potting compound, for example, wherein the potting compound encloses the peripheral face of the contact body in a sealing manner and the contact body projects outwardly with the outer face through the potting compound, so that the receiving opening is accessible for pressing in a press-in contact. The contact body makes it possible to press in the press-in contact even after applying the potting compound. Moreover, the contact body completely covers the printed circuit board area under the mounting face, so that a recess into which the potting compound cannot enter can also be provided there in the printed circuit board.

In a further exemplary embodiment, it is provided that the potting compound is applied onto the printed circuit board after pressing in the press-in contact. In this case, a recess is not provided in the printed circuit board under the contact body, so that the potting compound can also be applied on the outer face of the contact body and can enter into the receiving opening from the outer face.

The electrical contact assembly can be used on a transmission control module for controlling a motor vehicle transmission in a particularly advantageous manner. Transmission control modules are often installed in the hydraulic fluid of the transmission, such that the sealing of the electronic circuit by means of a potting compound here represents significant added value. The electrical contact assembly here advantageously makes it possible to contact structural parts, the electrical connections of which are formed as press-in contacts, to the electrical printed circuit board, even after the potting compound is produced.

DETAILED DESCRIPTION

Figure 1:
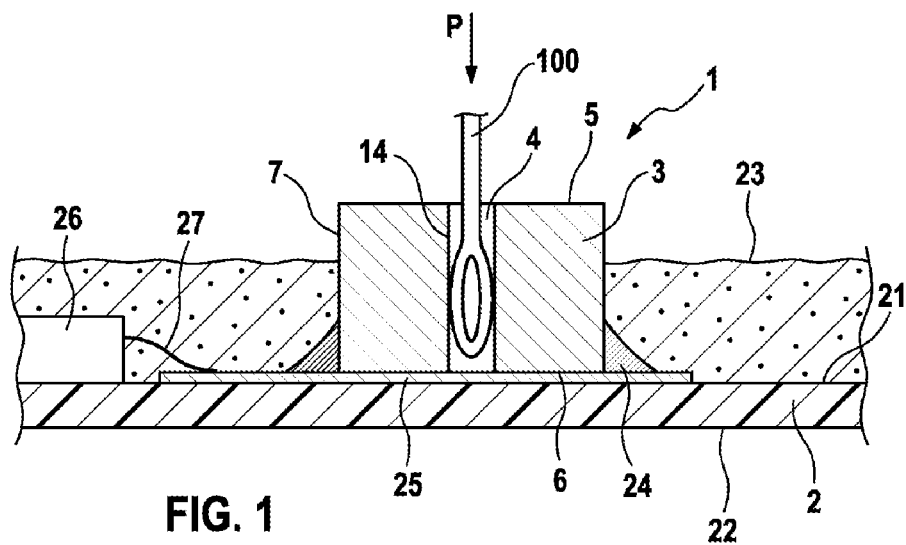
FIG. 1 shows a detail of a cross section through a first exemplary embodiment of an electrical contact assembly.
Figure 2:
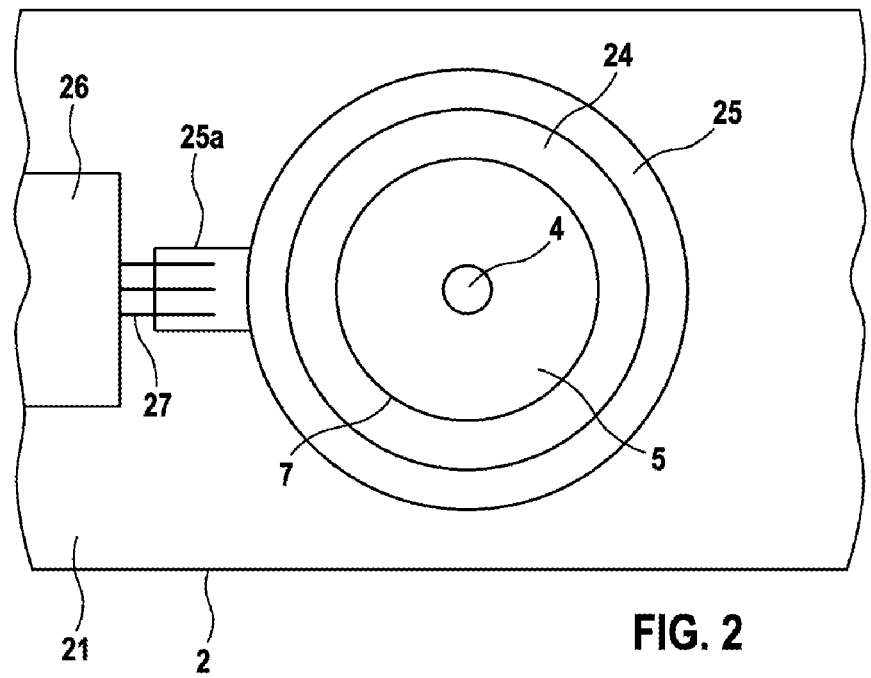
FIG. 2 shows a top view onto the embodiment from FIG. 1 without a potting compound and without a press-in contact.

FIG. 1 shows a detail of a cross section through a first exemplary embodiment of an electrical contact assembly 1. FIG. 2 shows the same assembly in a top view without a press-in contact and without a potting compound. The contact assembly 1 comprises a rigid printed circuit board 2, on which an electronic circuit 26 is assembled. FIG. 1 only shows one single component of the electronic circuit 26, the connections 27 of which are electrically connected to a conductor track 25a on a component fitting side 21 of the printed circuit board 2. The conductor track 25a is attached in one piece to a circular contact face 25, for example, on the component fitting side of the printed circuit board 2. The contact face 25 can be formed as copper metallization, for example. A contact body 3 is fitted onto the component fitting side 21 of the printed circuit board 2. The contact body 3 has a mounting face 6 which faces the printed circuit board 2, an outer face 5 which faces away from the mounting face 6, and a circumferential peripheral face 7. In the exemplary embodiment represented here, the contact body 3 is formed as a socket with a circumferential, cylindrical peripheral face 7. In the contact body 3, a receiving opening is formed which, starting from the outer face 5, extends into the contact body 3 perpendicular to the component fitting side 21 of the printed circuit board 2. The receiving opening 4 is, for example, formed centrally in the contact body 3 as a cylindrical channel, for example by a bore. Although it is possible to form the receiving opening as a blind hole, the receiving opening is preferably formed as a through-opening which passes through the contact body 3 from the outer face 5 to the mounting face 6.

The contact body 3 is fitted onto the printed circuit board as an SMD component using SMT technology, in other words the contact body is placed onto the contact face 25 with the mounting face 6 and is electrically contacted by a surface soldering to the contact face 25. As can be seen in FIG. 1, the solder application is applied circumferentially around the peripheral face 7, for example annularly, and electrically and mechanically connects the lower edge of the peripheral face 7 to the contact face 25.

The contact body 3 can be formed completely from metal or as a plastics material part with a metallic inner sleeve in which the receiving opening 4 is assembled. For electrically contacting the inner sleeve of the contact body to the contact face 25, the metallic inner sleeve can be attached to a circumferential metallic face of the outer peripheral face of the contact body 3, for example by means of a conductive bridge contact which is guided through the plastics material of the contact body, which metallic outer face in turn can be soldered to the contact face 25 by means of the solder application using SMT technology. Regardless of the formation of the contact body 3, the inner wall 14 is provided with an electrically conductive inner wall 14 throughout, for example in that the contact body consists entirely of metal or has said metallic inner sleeve.

The component fitting side 21 of the printed circuit board 2 is covered with a curable potting compound 23. In this case, it can preferably be a thermoset, in particular an epoxy resin. The potting compound 23 covers the electronic circuit 26 and therefore protects it from external influences. As can be readily seen in FIG. 1, the distance of the outer face 5 from the mounting face 6 of the contact body 3 is dimensioned such that the contact body 3 projects outwardly with the outer face 5 through the potting compound 23, so that the receiving opening 4 is accessible for pressing in a press-in contact 100 in the outer space. The potting compound 23 encloses the peripheral face 7 of the contact body 3 in a sealing manner, so that no aggressive medium can infiltrate the printed circuit board 2 along the peripheral face 7.

A press-in contact 100, for example a connection end of an electrical structural part, actuator, sensor, plug part or capacitor or a different electrical component, can be pressed into the receiving opening 4 of the contact body 3 from the outer face 5 in the direction of the arrow P. In this exemplary embodiment, the maximum press-in depth is thus delimited by the the press-in contact butting against the contact face 25. The press-in contact 100 presses at least in sections (for example with a thickening) against the receiving opening 4 which is provided with an electrically conductive inner wall 14 throughout, such that electrical contact is always guaranteed, regardless of the press-in depth.

Figure 3:
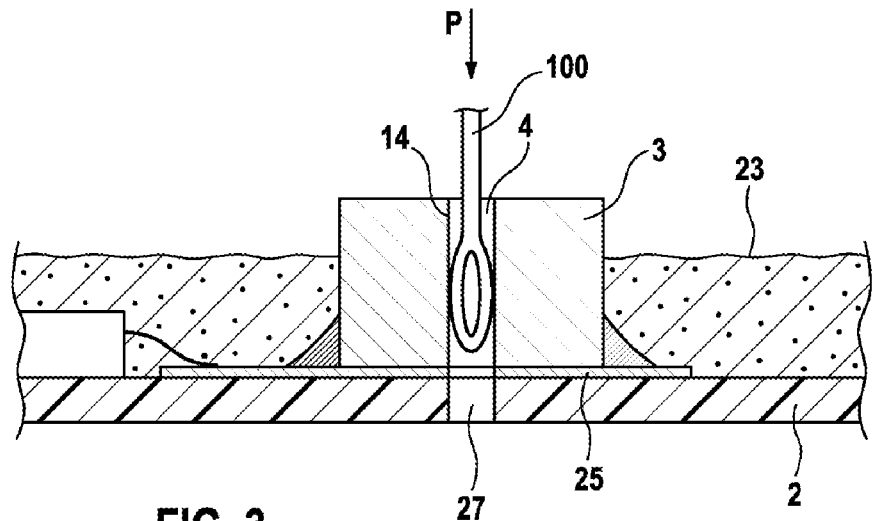
FIG. 3 shows a detail of a cross section through a second exemplary embodiment of an electrical contact assembly.

FIG. 3 shows a second exemplary embodiment in which a recess 27 is additionally provided in the printed circuit board 2. The recess 27 is assembled in the contact face 25 and can pass through the printed circuit board 2 as a bore or aperture from the component fitting side 21 to the side 22 which faces away from the component fitting side 21. The recess 27 is preferably formed coaxially to the receiving opening 4, in other words the longitudinal axes of the receiving opening and the recess coincide. Additionally, but not necessarily, the diameter of the recess 27 can correspond to the diameter of the receiving opening 4, so that the recess 27 is in alignment with the receiving opening 4. The recess 27 of the printed circuit board 2 advantageously makes it possible to insert the press-in contact 100 deeper into the receiving opening 4. The contact body 3 which is soldered onto the contact face 25 nevertheless ensures that the potting compound cannot flow through the recess 27 when being applied onto the printed circuit board 2.

Figure 4:
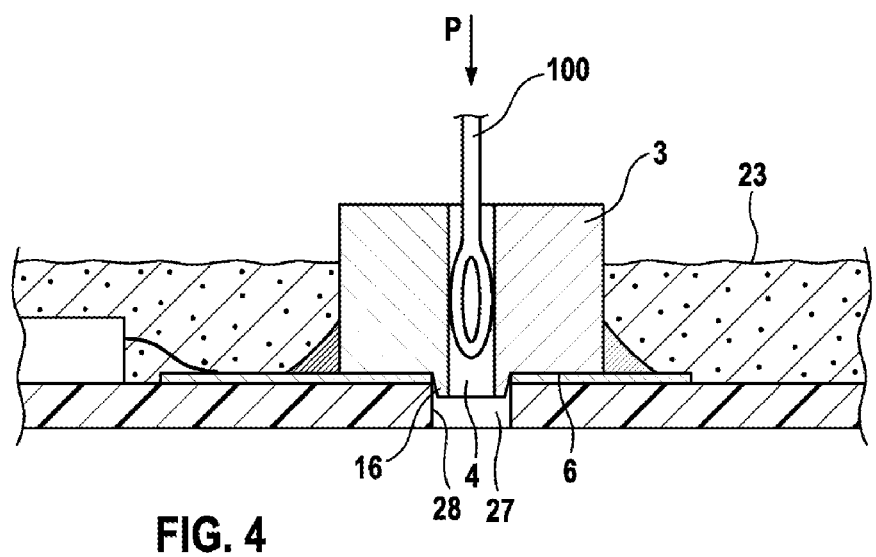
FIG. 4 shows a detail of a cross section through a third exemplary embodiment of an electrical contact assembly.

FIG. 4 shows a third exemplary embodiment in which the contact body 3 has a centering collar 16 for aligning the contact body 3 with the printed circuit board 2, which centering collar protrudes from the mounting face 6 and projects into the recess 27 of the printed circuit board 2. The centering collar 16 can have cone-shaped flanks which press against the inner wall 28 of the recess 27 during the placement of the contact body 3 and as a result aligns and additionally centers the contact body 3 in its component fitting position on the printed circuit board 2. The centering collar 16 can be provided with ridges which are distributed over the circumference, for example. Tolerances from the component fitting side (x-y plane) can be reduced during pressing into the recess 27. A tolerance can additionally be compensated by the ridges in the direction (z) which is perpendicular thereto.

Figure 5:
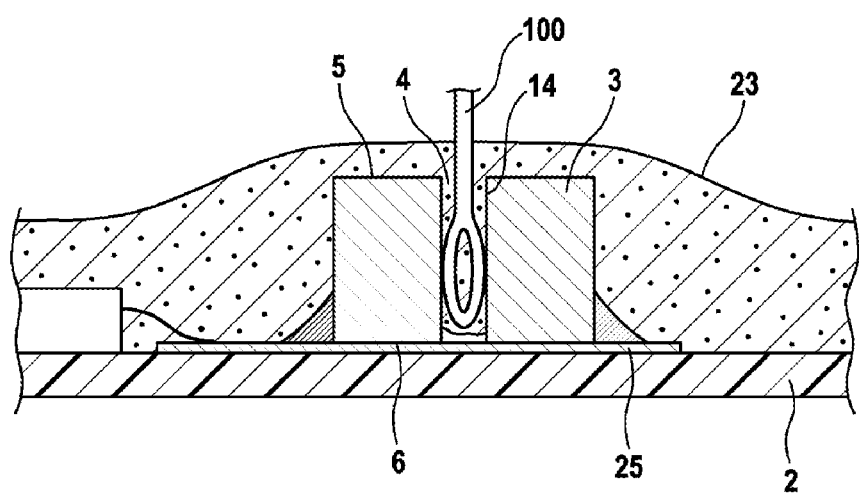
FIG. 5 shows a detail of a cross section through a fourth exemplary embodiment of an electrical contact assembly.

FIG. 5 shows a fourth exemplary embodiment in which the potting compound is applied onto the printed circuit board 2 after pressing in the press-in contact 100. In this case, the printed circuit board 2 is formed to be locked under the contact body 3. In this exemplary embodiment, the potting compound 23 is also applied on the outer face 5 of the contact body 3 which faces away from the mounting face 6. In this example, the potting compound can also enter into the receiving opening 4 from the outer face 5 and can completely or partially fill the part of the receiving opening 4 which is not occupied by the press-in contact 100. In this case, the potting compound also encases the plug-in section of the press-in contact, so that it is additionally protected.

The invention claimed is:

1. An electrical contact assembly for connecting a press-in contact to an electronic circuit, comprising:
   a printed circuit board on which the electronic circuit is arranged;
   a contact body defining a receiving opening configured to receive a press-in contact, the receiving opening defined by an electrically conductive inner wall throughout; and
   at least one conductor track of the printed circuit board, the conductor track electrically connected to the inner wall and to the electronic circuit,
   wherein the contact body is electrically connected to the conductor track and is deposited onto a component fitting side of the printed circuit board as an SMT-capable component,
   wherein:
      the contact body has a mounting face facing the printed circuit board, an outer face facing away from the mounting face, and a circumferential peripheral face, and
      the receiving opening, starting from the outer face, extends into the contact body perpendicular to the component fitting side of the printed circuit board, and
   wherein:
      the electronic circuit is covered at least partially with a potting compound on the component fitting side,
      the potting compound encloses the peripheral face of the contact body in a sealing manner, and
      the contact body projects outwardly with the outer face protruding through the potting compound such that the receiving opening is accessible for pressing in a press-in contact.

2. The electrical contact assembly as claimed in claim 1, wherein the receiving opening is formed as a through-opening which passes through the contact body from the outer face to the mounting face.

3. The electrical contact assembly as claimed in claim 2, wherein the printed circuit board has a recess which adjoins the receiving opening.

4. The electrical contact assembly as claimed in claim 3, wherein the contact body has a centering collar configured to align the contact body with the printed circuit board, the centering collar protruding from the mounting face and projecting into the recess of the printed circuit board.

5. The electrical contact assembly as claimed in claim 3, wherein the recess is coaxial with the receiving opening.

6. The electrical contact assembly as claimed in claim 1, wherein:
   the contact body is configured as a socket with a circumferential, cylindrical peripheral face, and
   the receiving opening is defined centrally in the contact body as a cylindrical channel.

7. The electrical contact assembly as claimed in claim 1, wherein:
   the contact body is directly deposited with the mounting face on a contact face, which is connected to the conductor track and is arranged on the component fitting side of the printed circuit board, and
   the peripheral face is at least partially electrically and mechanically connected to the contact face by a solder application encircling the peripheral face.

8. The electrical contact assembly as claimed in claim 1, wherein the contact body is formed completely from metal or as a plastics material part with a metallic inner sleeve in which the receiving opening is defined.

9. The electrical contact assembly as claimed in claim 1, wherein the electrical contact assembly is included in a transmission control module for controlling a motor vehicle transmission.

10. An electrical contact assembly for connecting a press-in contact to an electronic circuit, comprising:
    a printed circuit board on which the electronic circuit is arranged;
    a contact body defining a receiving opening configured to receive a press-in contact, the receiving opening defined by an electrically conductive inner wall throughout; and
    at least one conductor track of the printed circuit board, the conductor track electrically connected to the inner wall and to the electronic circuit,
    wherein the contact body is electrically connected to the conductor track and is deposited onto a component fitting side of the printed circuit board as an SMT-capable component,
    wherein:
       the contact body has a mounting face facing the printed circuit board, an outer face facing away from the mounting face, and a circumferential peripheral face, and
       the receiving opening, starting from the outer face, extends into the contact body perpendicular to the component fitting side of the printed circuit board, and
    wherein:
       the electronic circuit is covered at least partially with a potting compound on the component fitting side, and
       the potting compound encloses the peripheral face and the outer face of the contact body in a sealing manner.

11. An electrical contact assembly for connecting a press-in contact to an electronic circuit, comprising:
    a printed circuit board on which the electronic circuit is arranged;
    a contact body defining a receiving opening configured to receive a press-in contact, the receiving opening defined by an electrically conductive inner wall throughout; and
    at least one conductor track of the printed circuit board, the conductor track electrically connected to the inner wall and to the electronic circuit,
    wherein the contact body is electrically connected to the conductor track and is deposited onto a component fitting side of the printed circuit board as an SMT-capable component, and
    wherein the electrical contact assembly is included in a transmission control module for controlling a motor vehicle transmission.

* * * * *